United States Patent [19]
Redwine

[11] Patent Number: 4,989,055
[45] Date of Patent: Jan. 29, 1991

[54] DYNAMIC RANDOM ACCESS MEMORY CELL

[75] Inventor: Donald J. Redwine, Houston, Tex.

[73] Assignee: Texas Instruments Incorporated, Dallas, Tex.

[21] Appl. No.: 366,561

[22] Filed: Jun. 15, 1989

[51] Int. Cl.⁵ .................. H01L 29/78; H01L 27/02
[52] U.S. Cl. .......................... 357/23.6; 357/23.14; 357/23.15; 357/47
[58] Field of Search ............ 357/23.6, 23.4, 23.14, 357/23.15, 47, 49

[56] References Cited

U.S. PATENT DOCUMENTS

| 4,673,962 | 6/1987 | Chatterjee et al. | 357/23.6 |
| 4,769,786 | 9/1988 | Garnacle et al. | 365/182 |

FOREIGN PATENT DOCUMENTS

| 61-22665 | 1/1986 | Japan | 27/10 |
| 61-285753 | 12/1986 | Japan | 27/10 |
| 62-269363 | 11/1987 | Japan | 29/78 |
| 63-50056 | 3/1988 | Japan | 27/10 |
| 63-72150 | 4/1988 | Japan | 27/10 |

OTHER PUBLICATIONS

IBM Tech. Disclosure, vol. 31, #7, Dec. 88 (p. 307).

Primary Examiner—Jerome Jackson, Jr.
Assistant Examiner—Stephen D. Meier
Attorney, Agent, or Firm—Ronald O. Neerings; Thomas W. Demond; Melvin Sharp

[57] ABSTRACT

The described embodiments of the present invention provide a dynamic random access memory cell and array. The memory cell provides a three transistor storage device where the storage signal is stored on the gate of a storage transistor. All three transistors are integrated into a trench thereby providing the density equal to that of the densest of modern day DRAM cells. By using the three transistor concept, the first embodiment of the present invention provides a gain for the stored charge. Because the storage transistor amplifies the stored charge, the reduced capacitance of ultra-dense DRAM cells is overcome and adequate data sensing may be accomplished using capacitances much smaller than those useful in the single transistor, single capacitor DRAM cell.

10 Claims, 16 Drawing Sheets

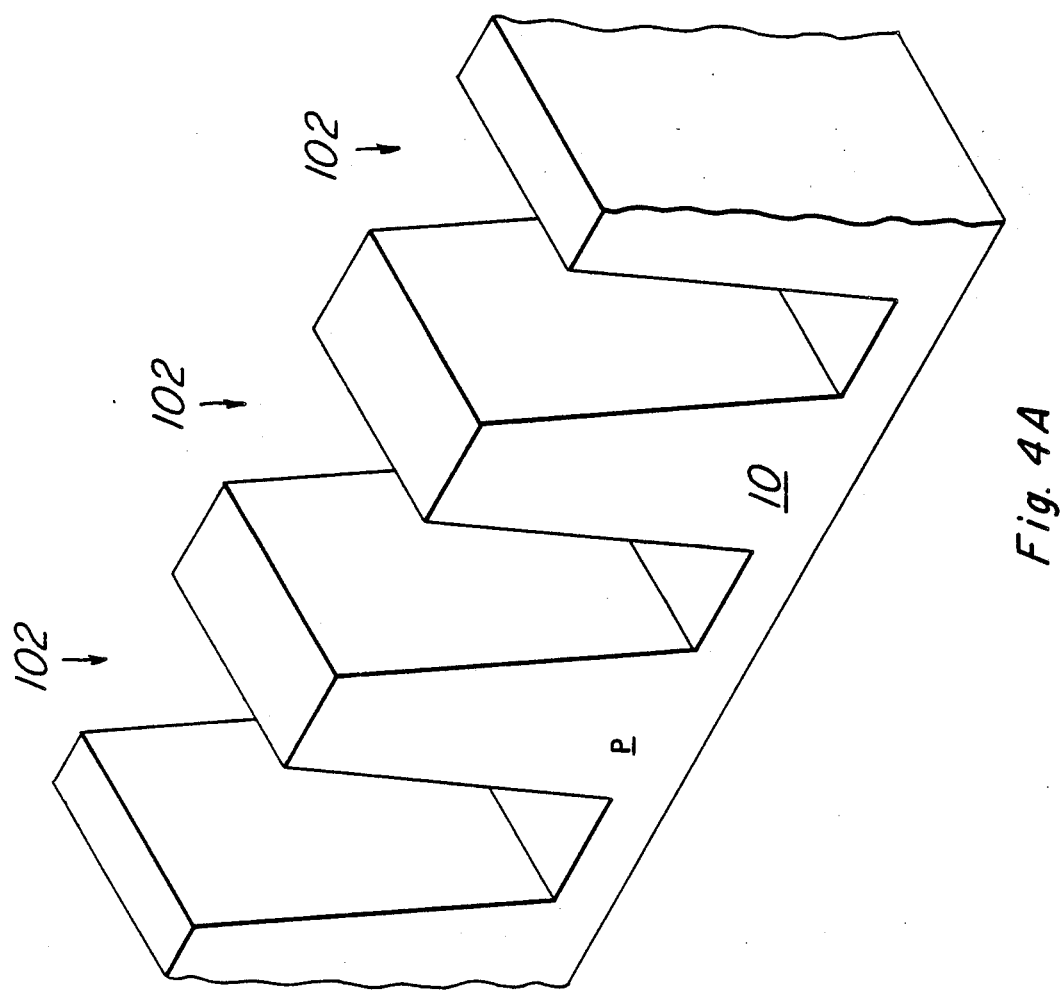

DYNAMIC RANDOM ACCESS MEMORY CELL

FIELD OF THE INVENTION

The present invention relates to the field of integrated circuit design and fabrication. More specifically, the present invention relates to the field of dynamic random access memories.

BACKGROUND OF THE INVENTION

The development of modern data processing devices has created a huge need for digital memory storage capacity. This has created intense pressure on integrated circuit manufacturers to provide memory chips having greater and greater memory capacity. Dynamic random access memories (DRAMs) are by far the densest of memory technologies. Because of the simple structure of dynamic random access memory cells, more memory cells can be packed into a single integrated circuit.

The predominantly used memory cell technology in DRAMs is the single transistor, single capacitor cell type. In this cell, current flow to one plate of a capacitor is controlled by a transistor. The data is stored in the capacitor and is read back as the charge on the capacitor. The single transistor, single capacitor memory cell has served well through many generations of dynamic random access memories. However, current technologies have shown limitations to the usefulness of the single capacitor, single transistor memory cell. One limitation is caused by the physical limits of capacitors. Roughly speaking, the capacitance value of a capacitor is proportional to the area of the capacitor. As DRAM cells are shrunk, the capacitance of the single capacitor DRAM cell necessarily shrinks. The smaller the capacitance of the storage capacitor, the more likely an alpha particle or stray voltage spike will destroy the stored charge or create a noise spike which will generate an error when the data is to be read from the memory cell. Therefore, a more effective method of storage is necessary than the use of a single capacitor.

One DRAM cell which does not rely solely on stored capacitives for all of its operational characteristics is the three transistor cell. In the three transistor cell, data is stored using the capacitance of a gate in a field effect transistor. A write transistor controls the flow of current to the gate of the storage transistor. When a logical 1 is to be written to the memory cell, a high voltage is placed on the drain of the write transistor and a high voltage is placed on the gate of the write transistor (assuming all transistors in the memory cell are N-channel transistors). The voltage level conducted to the gate of the storage transistor charges the gate of the storage transistor. The gate voltage of the write transistor is then brought to near 0 volts thus causing the write transistor to cease conducting. This traps charge on the gate of the storage transistor. The third transistor, the read transistor, connects the drain of the storage transistor to a read output terminal. When a high voltage is placed on the gate of the read transistor, the drain of the storage transistor is conductively connected to the read terminal. The read terminal is usually connected to a bitline where a multiplicity of memory cells are connected to the bitline. A sense amplifier is then used to determine the conductivity of the series connected read access transistor and the storage transistor. If a positive charge is stored on the gate of the storage transistor, both the read transistor and the storage transistor will conduct thus connecting a low impedance to a reference potential. This is detected by the sense amplifier and the stored logical 1 state is provided to the output circuitry. If a negative or close to 0 charge is stored on the gate of the storage transistor, the storage transistor will not conduct and the sense amplifier will see a high impedance from the bitline to the reference potential. The sense amplifier will then provide a logical 0 output signal to the output circuitry.

The three transistor memory cell was largely superseded by the single transistor, single capacitor cell because three transistors occupy more area than the single transistor and a single capacitor. In addition, highly integrated single transistor, single capacitor memory cells were developed. For example, see Kuo, U.S. Pat. No. 4,240,092, issued Dec. 16, 1980 and assigned to the assignee of this application.

The advent of trench technology has created further advances in DRAM cell technology. An example of this is Malhi, et al., U.S. Pat. No. 4,797,373, issued Jan. 10, 1989 and assigned to the assignee of this application. This reference shows a high density single transistor, single capacitor memory cell formed in a trench to minimize the planar area occupied by the memory cell. This further advances the size advantage of the single transistor, single capacitor memory cell.

SUMMARY OF THE INVENTION

The described embodiments of the present invention provide a dynamic random access memory cell and array. The memory cell provides a three transistor storage device where the storage signal is stored on the gate of a storage transistor. All three transistors are integrated into a trench thereby providing the density equal to that of the densest of modern day DRAM cells. By using the three transistor concept, the first embodiment of the present invention provides a gain for the stored charge. Because the storage transistor amplifies the stored charge, the reduced capacitance of ultra-dense DRAM cells is overcome and adequate data sensing may be accomplished using capacitances much smaller than those useful in the single transistor, single capacitor DRAM cell.

In one embodiment of the present invention, the gates of the read and write transistors are coupled together and connected to a common word line. The bitlines of the memory array run perpendicular to the word lines in diffusions at the surface of the substrate.

In another embodiment of the present invention, separate read and write word lines are formed on the sidewalls of either side of the memory cell trench. Because the word lines are formed in the trench, a surface bitline connected to the diffusions on the surface of the substrate may be fabricated.

BRIEF DESCRIPTION OF THE DRAWINGS

The invention is defined by the claims appended hereto. Specific embodiments of the invention are described in the following detailed description and may be best understood in conjunction with the drawings wherein:

FIGS. 4A through 4D are side view schematic diagrams (some with perspective) showing the fabrication steps for the preliminary fabrication of the embodiment shown in FIG. 1;

DETAILED DESCRIPTION

Figure 1:
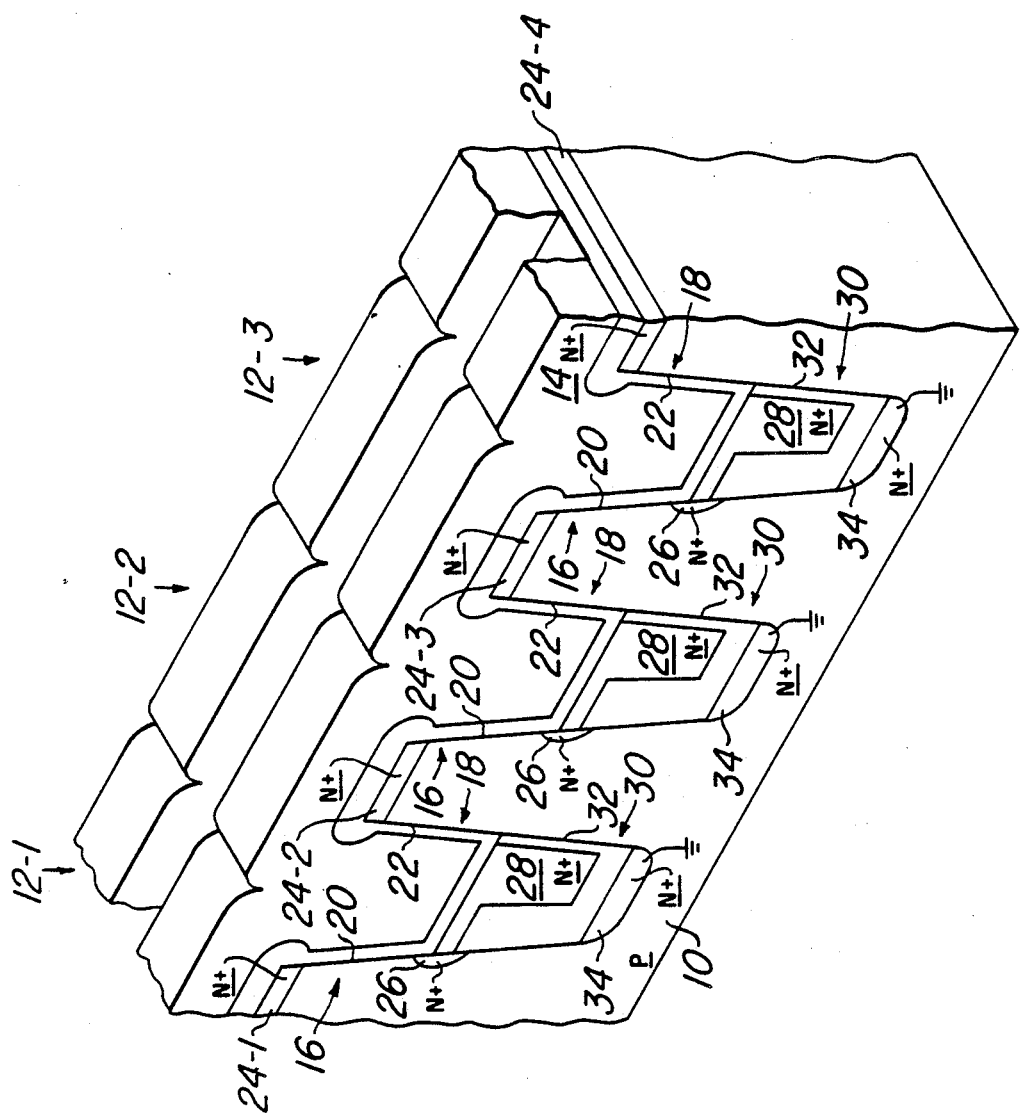
FIG. 1 is a side view with perspective of a section of one embodiment of the present invention.
Figure 2:
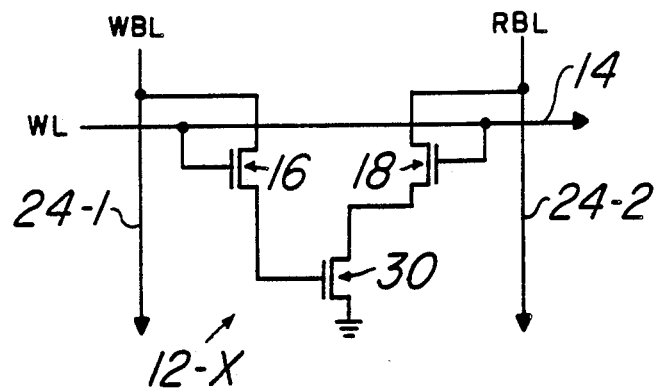
FIG. 2 is a schematic diagram showing the electrical operation of one memory cell of the embodiment shown in FIG. 1.
Figure 3:
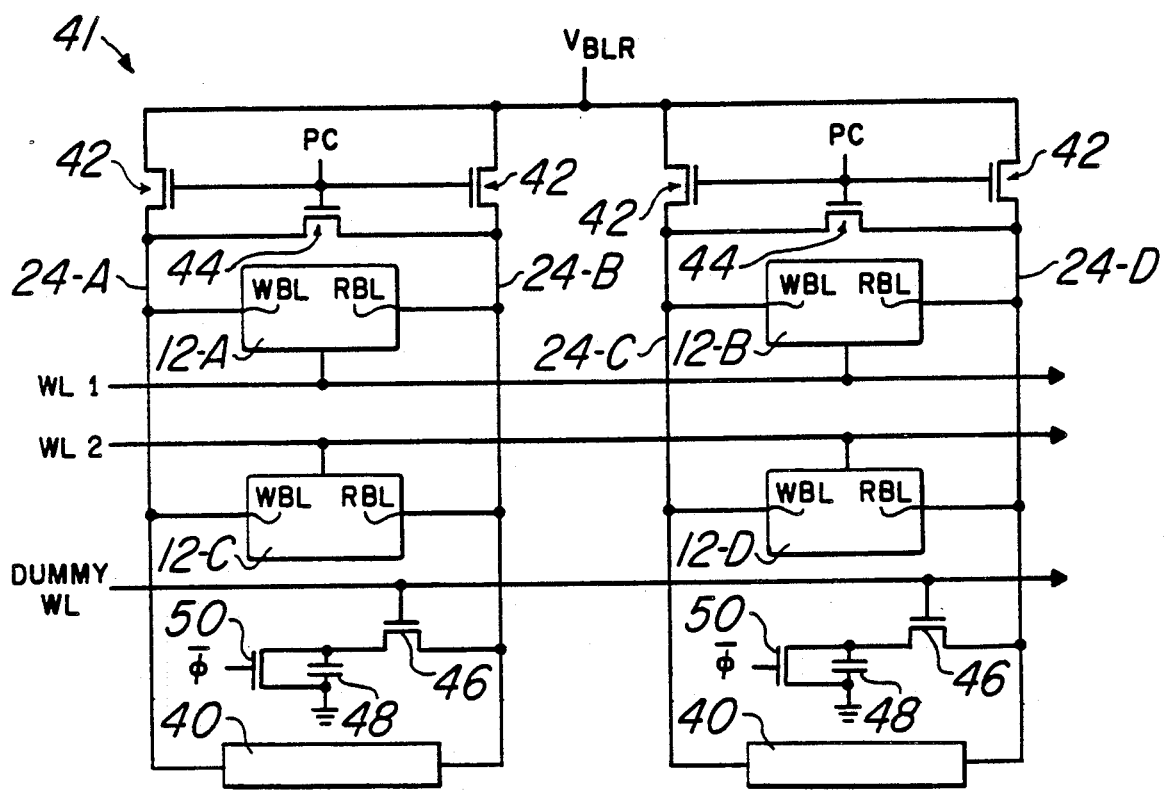
FIG. 3 is a schematic diagram of another embodiment of the present invention including memory cells as described with regard to FIG. 1.
Figure 4B:
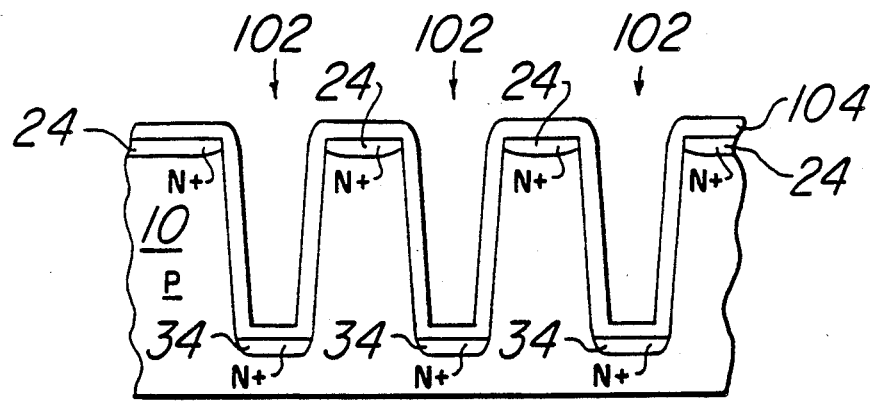
Figure 4C:
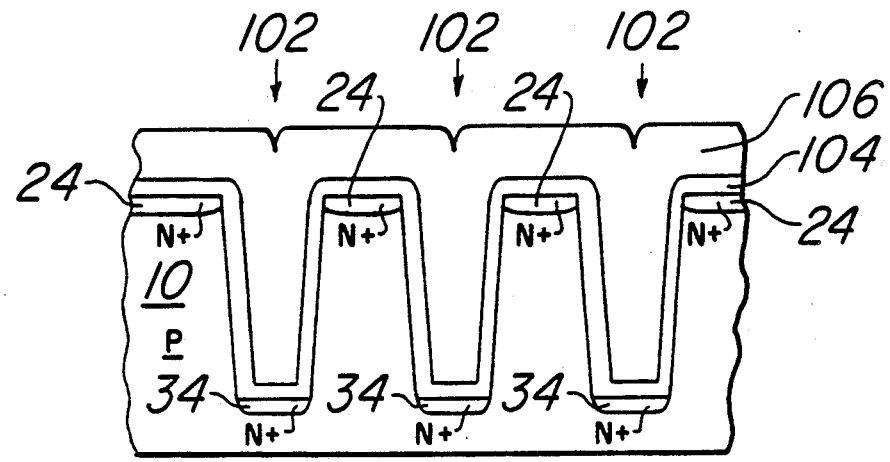
Figure 4D:
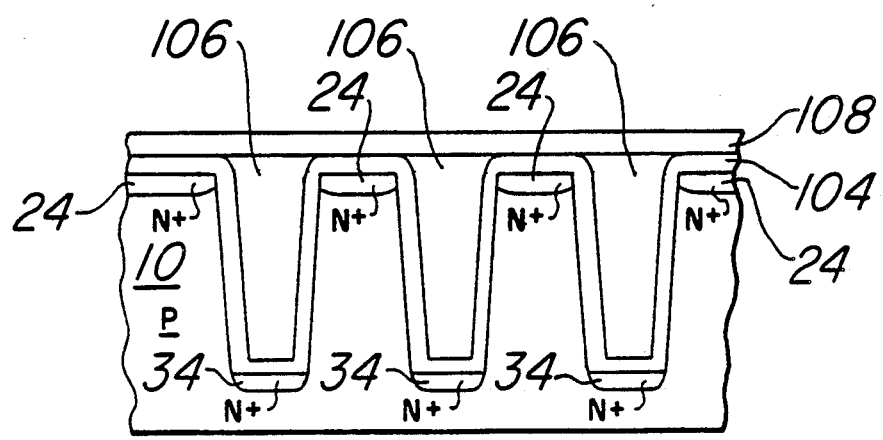
Figure 5:
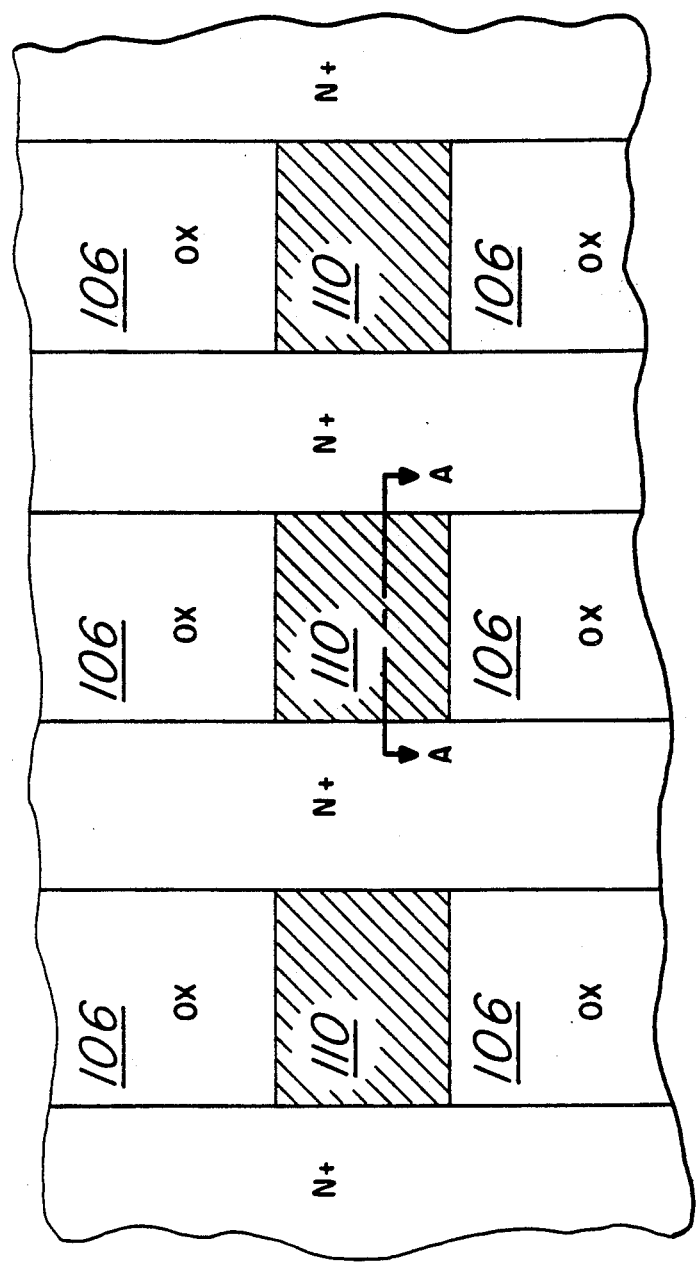
FIG. 5 is a plan view of an intermediate step in the fabrication of the embodiment of FIG. 1.
Figure 6A:
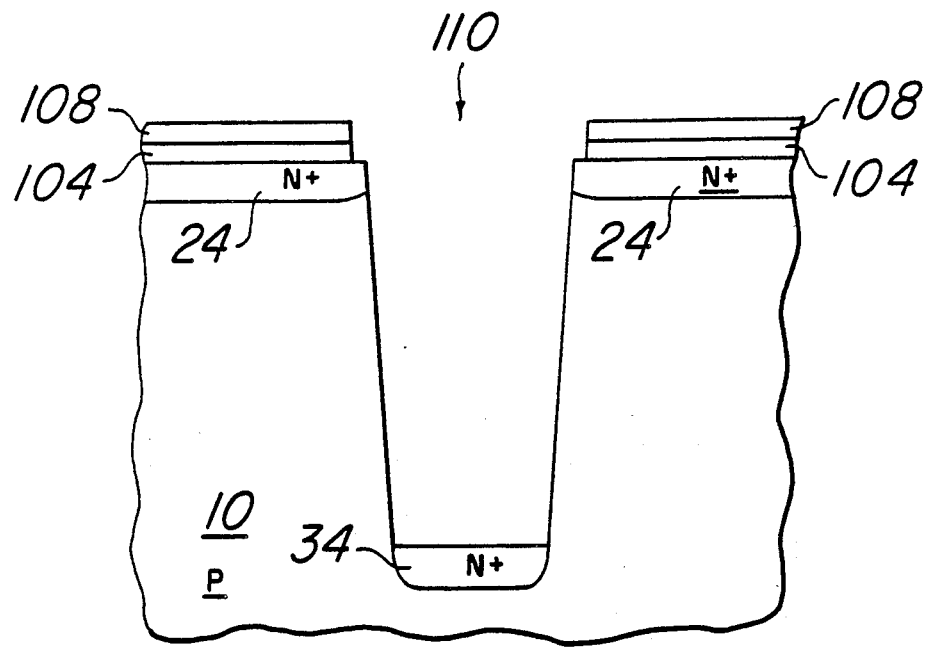
FIGS. 6A through 6H are side view schematic diagrams showing the balance of the fabricating steps necessary to fabricate the embodiment of FIG. 1.
Figure 6B:
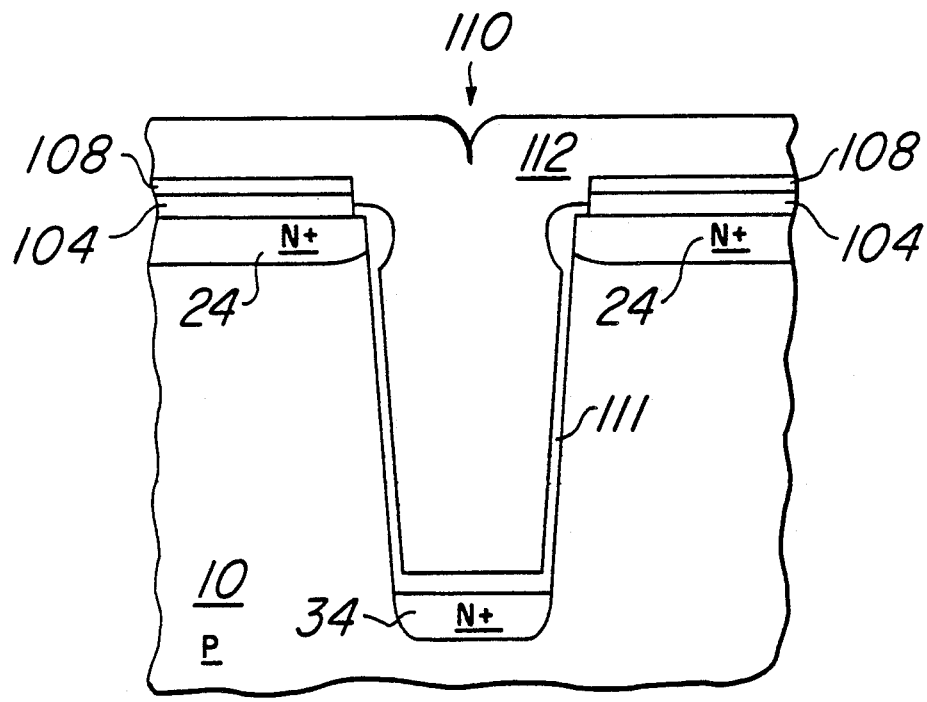
Figure 6C:
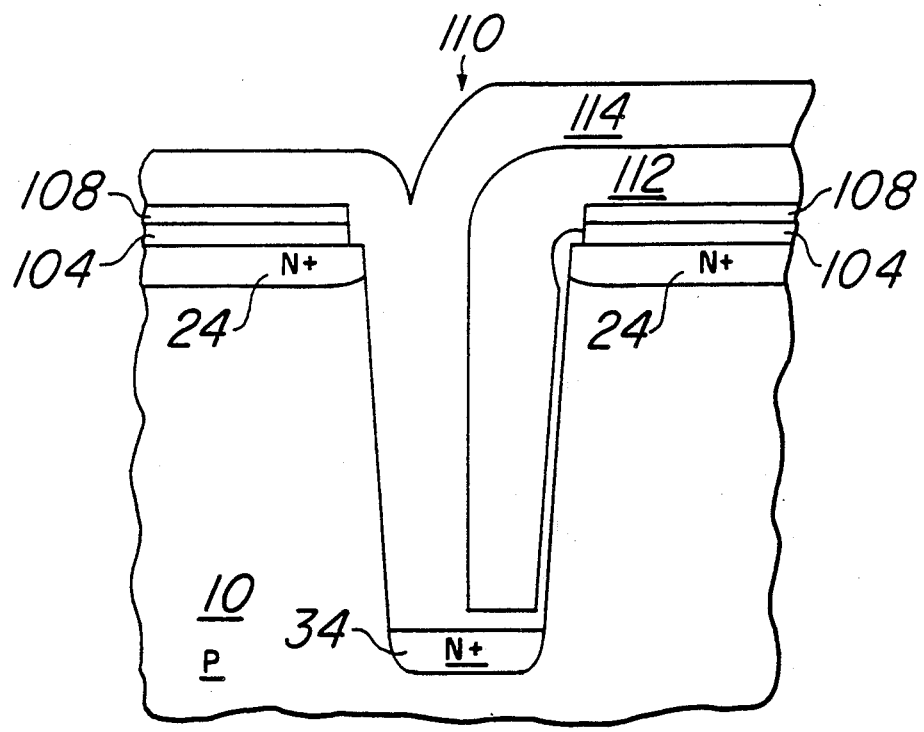
Figure 6D:
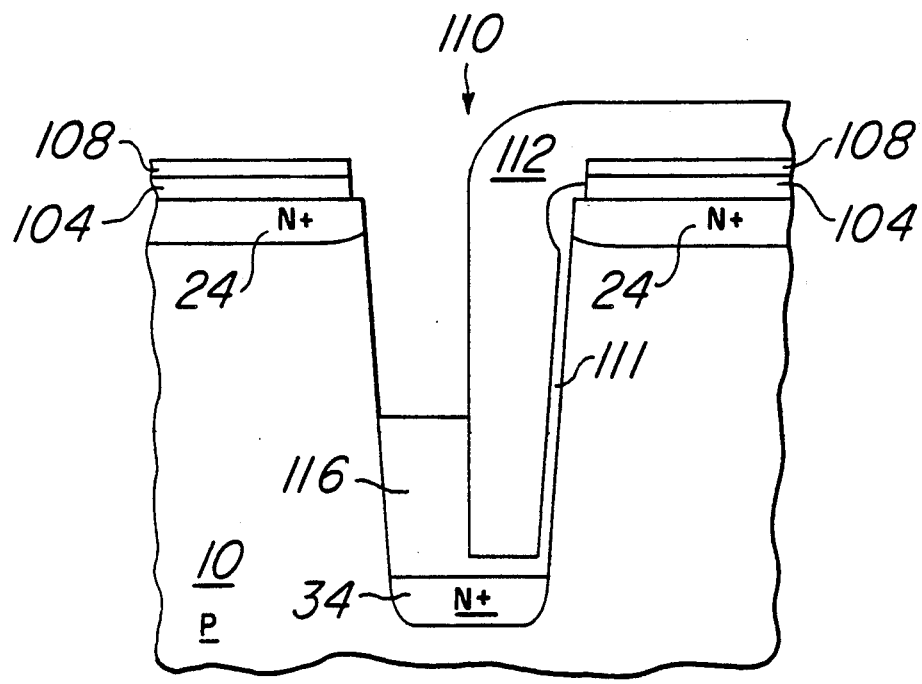
Figure 6E:
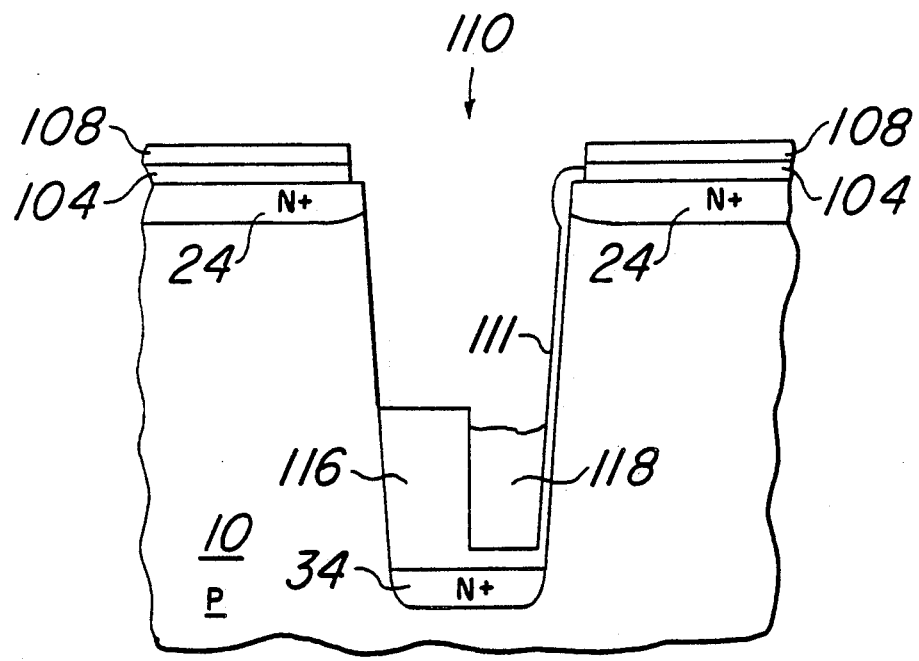
Figure 6F:
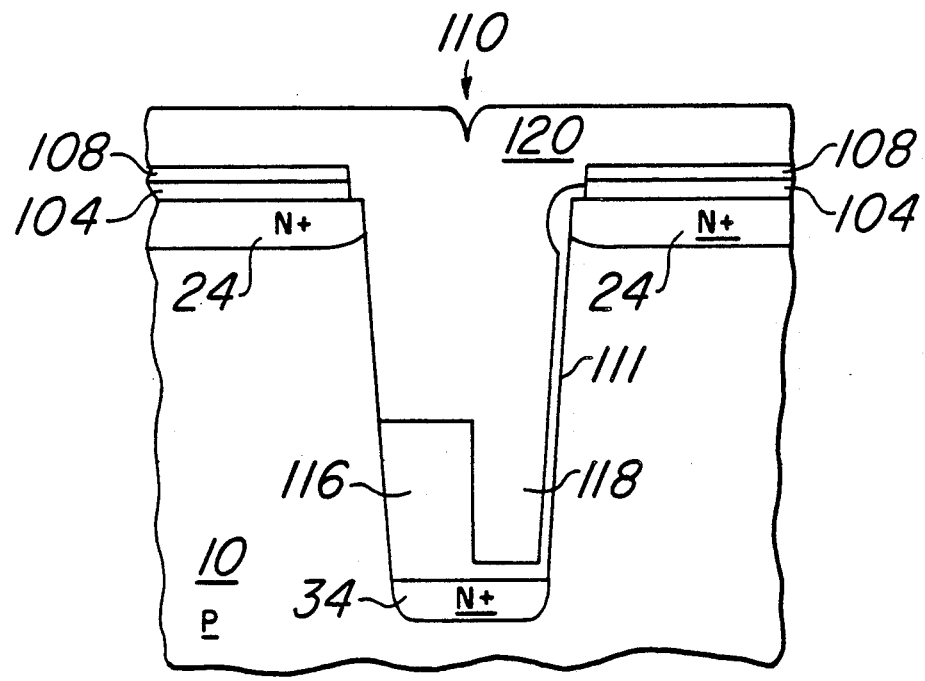
Figure 6G:
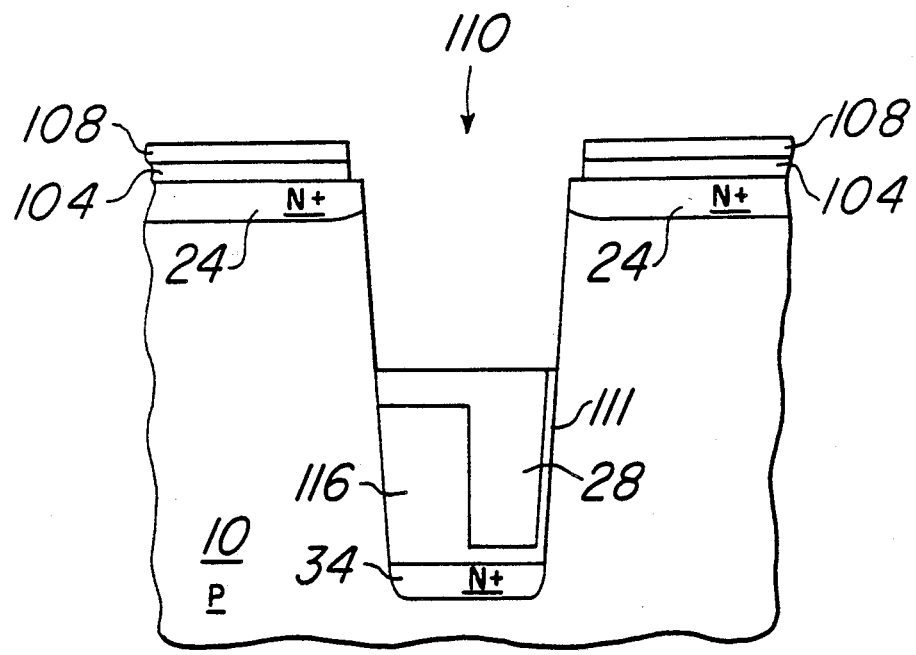
Figure 6H:
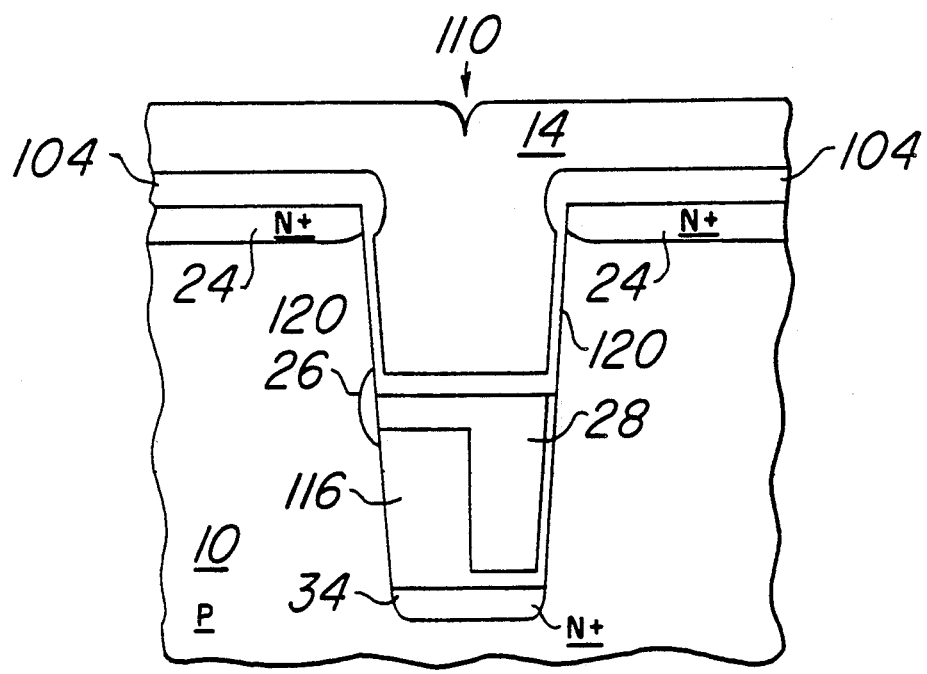
Figure 7:
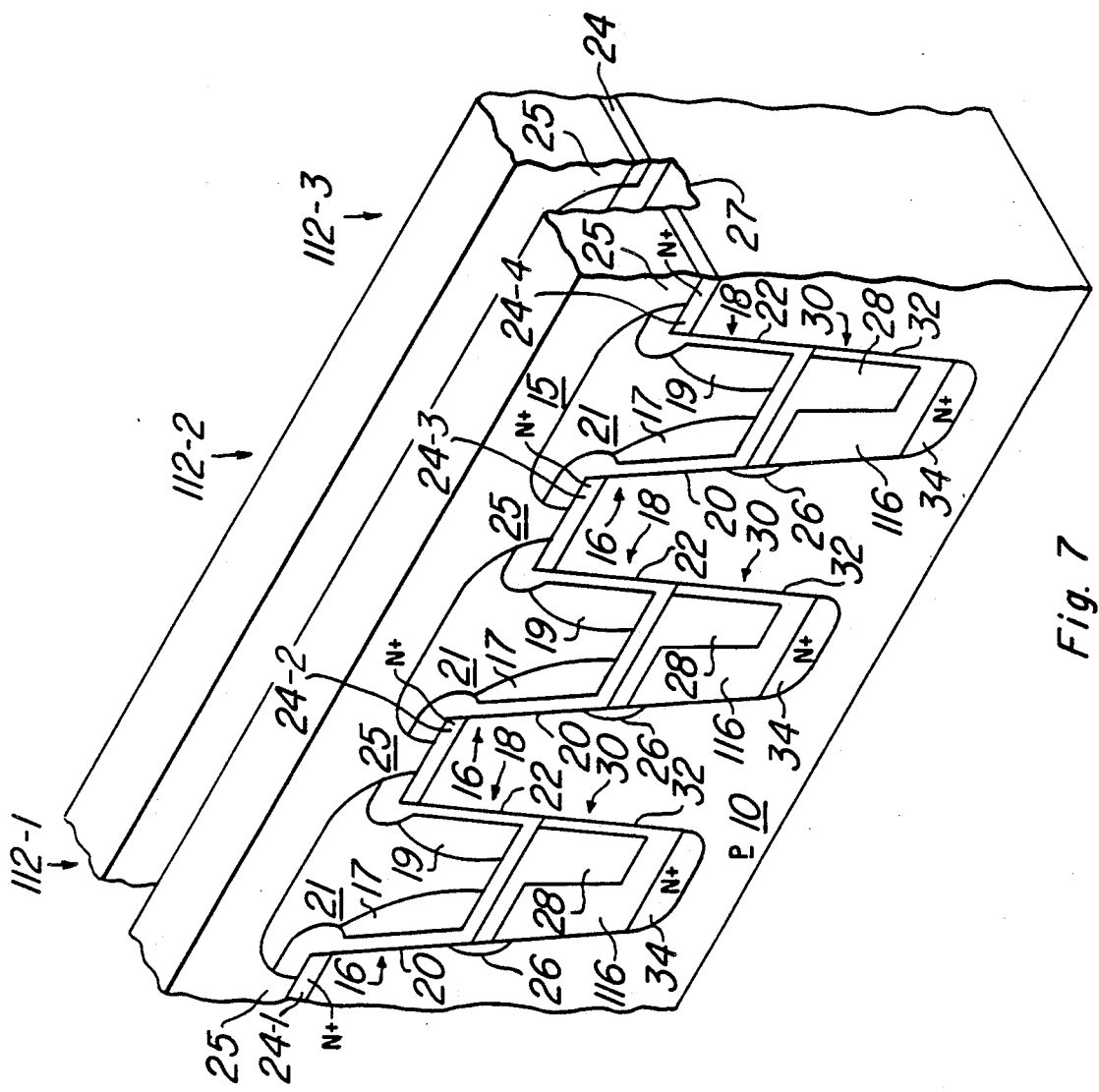
FIG. 7 is a side view perspective diagram of another embodiment of the present invention.
Figure 8:
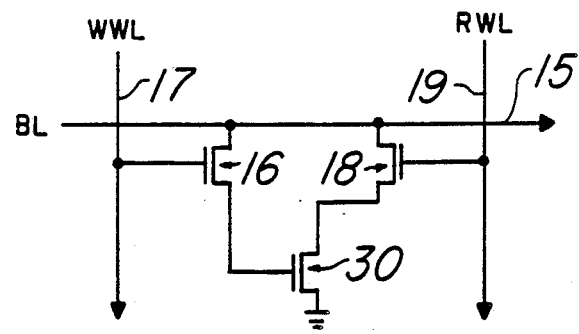
FIG. 8 is an electrical schematic diagram showing the electrical operation of the embodiment shown in FIG. 7.
Figure 9:
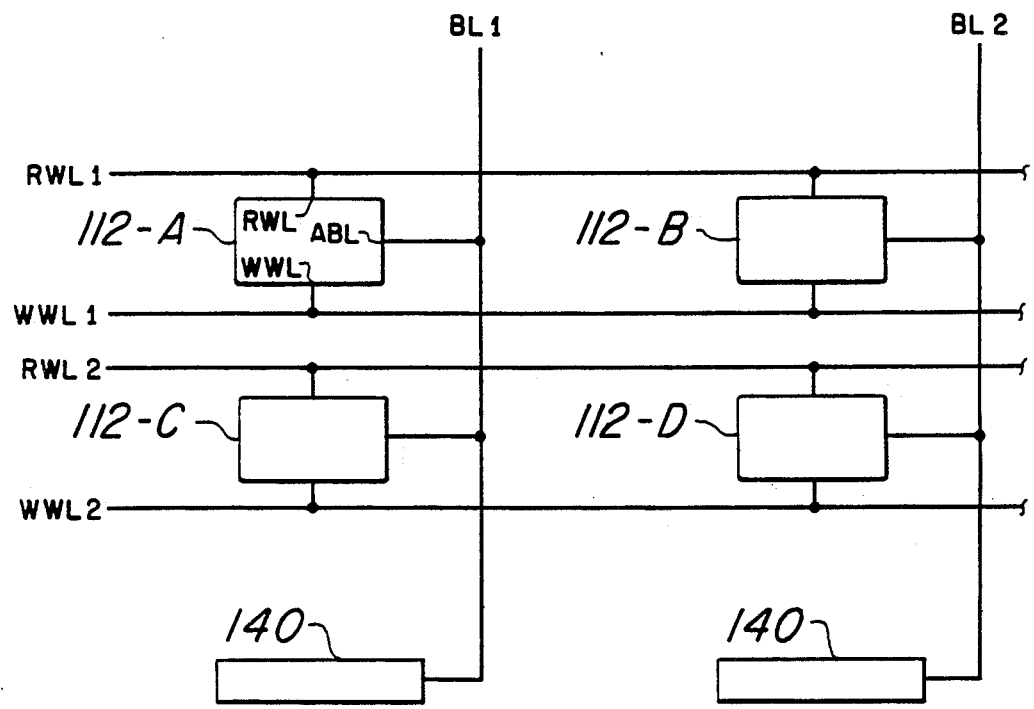
FIG. 9 is an electrical schematic diagram of another embodiment of the present invention including memory cells as shown in FIG. 7.

The preferred embodiments of the present invention are described with regard to FIGS. 1 through 10. FIG. 1 is a side view schematic diagram with perspective of a small portion of an array, which is one embodiment of the invention, containing a memory cell which is another embodiment of the present invention. FIG. 2 is an electrical schematic diagram describing the operation of a memory cell of the embodiment of FIG. 1. FIG. 3 is an electrical schematic diagram of another embodiment of the present invention. FIGS. 4A through 4D are side view schematic diagrams (FIG. 4A including perspective) of steps in fabrication of the embodiments shown in FIG. 1. FIG. 5 is a plan view of another step in the fabrication of the embodiment of FIG. 1. FIGS. 6A through 6H are side view schematic diagrams showing the processing steps for the fabrication of the embodiment of FIG. 1. FIG. 7 is a side view schematic diagram with perspective of another embodiment of the present invention. FIG. 8 is an electrical schematic diagram describing the operation of the memory cells of the embodiment of FIG. 7. FIG. 9 is an electrical schematic diagram of another embodiment of the present invention. FIGS. 10A through 10E are side view schematic diagrams, with perspective, of processing steps in the fabrication of the embodiment of FIG. 7.

FIG. 1 is a side view schematic diagram of one embodiment of the present invention comprising a plurality of memory cells, each memory cell comprising another embodiment of the present invention. Shown in side view are memory cells 12-1, 12-2 and 12-3. Each memory cell is identical and each uses polycrystalline silicon word line 14 as the gates of the access transistors of the memory cells. The memory cells are formed in p-type substrate 10. Each memory cell includes a write access transistor 16 and a read access transistor 18. In memory cell 12-1, for example, transistor 16 controls current between bitline 24-1 and source region 26 by applying voltage through polycrystalline silicon gate 14 which causes channel 20 to conduct. The voltage level placed on bitline 24-1 thus controls the charge level placed on polycrystalline silicon plug 28. Transistors 18 and 30 are positioned along the sidewall of the trench in which memory cell 12-1 is formed in a series fashion.

Therefore, when the voltage level on polycrystalline silicon word line 14 is above the threshold voltage of transistor 18 and the voltage level on polycrystalline silicon plug 28 is above the threshold voltage of transistor 30, a continuous conductive channel is provided between grounded N+ region 34 and bit line 24-2. By turning on transistor 18, the state of the stored data on polycrystalline silicon plug 28 may be determined by the conductivity of channel 32.

FIG. 2 is an electrical shematic diagram of the operation of one memory cell, such as memory cell 12-1 of FIG. 1. Reference numbers in FIG. 2 corresponding to reference numbers in FIG. 1 indicate electrical schematic representations of elements described with regard to FIG. 1.

FIG. 3 is an electrical schematic diagram of a memory array which is one embodiment of the present invention. Memory cells 12-A through 12-D have the electrical configuration as shown in FIG. 2 and the physical configuration of the memory cells shown in FIG. 1. Memory array 41 includes two bitlines for each column of memory cells. For example, bitline 24-A and 24-B provide the bitlines for the column of memory cells comprising memory cell 12-A and memory cell 12-C. This is a different configuration from that shown in the embodiment of FIG. 1 where bitlines such as bitline 24-3 provide the read bitline memory cell 12-2 and the write bitline for memory cell 12-3. By separating the bitlines, memory cell density is reduced but voltage control for reading and writing purposes is better.

The data control problems of the embodiment of FIG. 1 may be better understood by referring back to FIG. 1, when a high voltage level is placed on word line 14, both read transistor 18 of memory cell 12-2 and write transistor 16 of memory cell 12-3 are conductive. If transistor 30 of memory cell 12-2 is on, then the charge stored in storage gate 28 of cell 12-3, will be drained to ground through N+ region 34. This does not happen instantaneously and precautions must be taken to assure that data integrity is maintained. One method for dealing with this problem is quickly reading the data for an entire row of memory cells along the word line and then rewriting the data back to the memory cells. This will provide current going to ground through transistors 18 and 30 but, if the impedance from the bit position back down the bit line to the sense amp is low compared to the impedance of transistors 18 and 30, then logic-1 data can be stored onto storage gate 28.

The problems of shared bitlines in FIG. 1 are eliminated in FIG. 3 by providing separate read and write bitlines. For example, bitline 24-C provides the WRITE bitline for memory cells 12-B and 12-D and 24-B the READ bitline for memory cells 12-A and 12-C. When a high voltage on word line 1 causes the read and write access transistors of memory cells 12-A and 12-B to conduct, the status of the storage transistor and the read access transistor of memory cell 12-A does not affect the status of the data stored on the storage transistor in memory cell 12-B as is the case in the embodiment shown in FIG. 1. However, to provide this structure, it is necessary to eliminate every other memory cell down a wordline. For example, memory cell 12-2 of FIG. 1 would be removed so that bitline 24-2 could function as bitline 24-B of FIG. 3 and bitline 24-3 of FIG. 1 could function as bitline 24-C of FIG. 3. Therefore, density is reduced.

The optimal procedure for storing and accessing data in FIG. 3 goes as follows:

To write data to any of the memory cells, the appropriate sense amplifier 40 is driven into one of two possible states, by a data input buffer (not shown). The two bit lines RBL and WBL are therefore set, in response to the data input, to a high or low state simultaneously, a high voltage is placed on a word line, for example, when the data is to be stored in memory cell 12-A, a high voltage is placed on word line WL1 and the data is stored in the storage gate of memory cell 12-A.

To read the voltage stored in memory cell 12-A, bitlines 24-A and 24-B are precharged and equalized by providing a high precharge signal PC which causes transistors 42 and 44 to turn on. Transistors 42 connect bitlines 24-A and 24-B to a reference voltage $V_{BLR}$. Transistor 44 provides a conductive path between bitlines 24-A and 24-B so that the precise equivalent voltages are provided on these bitlines. Prior to accessing the data of memory cell 12-A, input signal $\Phi$ becomes high to discharge the stored charge on capacitor 48. $\Phi$ the returns to a low voltage level. Signal PC is then brought to a low voltage level and the voltage level on word line WL1 and dummy word line are brought to a high voltage level. The voltage level on the dummy word line WL causes transistor 46 to conduct thus causing capacitor 48 to be connected to bitline 24-B. Capacitor 48 is selected to have the same capacitance as the gate capacitance of transistor 30 (FIG.2) thus balancing the capacitive load on bitline 24-A by transistor 30. Sense amplifier 40 is a differential bistable device which compares the voltage on bitline 24-A to that of bitline 24-B and latches a data bit in response to that differential voltage. If a high voltage indicating a logical 1 is stored on the gate of transistor 30 of memory cell 12-A, transistor 18 and transistor 30 will be conductive, thus causing the voltage level on bitline 24-B to go lower. In addition, because the charge on the gate of storage transistor 30 is connected to bitline 24-A, the voltage level on bitline 24-A will be high. Thus, sense amplifier 40 will latch a data bit signal corresponding to a higher voltage on bitline 24-A and a lower voltage on 24-B. Conversely, if a low voltage is stored on the storage gate of transistor 30, transistor 30 will not conduct and the voltage level on bitline 24-B will not be reduced through transistor 18 and transistors 30. However, the low voltage stored on transistor 30 will reduce the voltage level on bitline 24-A causing sense amplifier 40 to latch the opposite signal from the previous data type. Of importance, the sensing of the low voltage stored on the gate of transistor 30 must be latched quickly because the charge on bitline 24-A will cause transistor 30 to turn on if the voltage on the gate of transistor 30 is allowed to go above the $V_t$ of transistor 30.

FIGS. 4A through 4D are side view diagrams showing the processing steps necessary for fabrication of the embodiment shown in FIG.1. Trenches 102 are formed in substrate 10 using an anisotropic etching process such as that disclosed in Douglas, U.S. Pat. No. 4,784,720 issued Nov.15,1988 and assigned to the assignee of this application. The trenches extend both forward and backward, given the perspective of FIG. 4A, to the ends of the array containing the memory cells of FIG. 1.

A layer of silicon dioxide 104 is then deposited on the surface of the structure of FIG. 4A as shown in FIG. 4B. Silicon dioxide layer 104 is deposited using low pressure chemical vapor deposition to a thickness of approximately 500 Angstroms. The structure is then subjected to an ion implantation using a vertically positioned ion source of arsenic ions having an energy of approximately 170 kiloelectron volts and a density of approximately $5 \times 10^{15}$ ions per centimeter squared. This ion implantation is then driven in to form bitlines 24 and N+ regions 34 as shown in FIG. 4B. The additional vertical thickness of silicon dioxide layer 104 on the sidewalls of trenches 102 absorbs the vertically traveling implanted ions. Thus the sidewalls of trench 102 are not doped.

Another layer of silicon dioxide 106 is then deposited on the surface of the structure in FIG. 4B to a thickness of at least half the width of the opening of trenches 102 at the surface of substrate 10. In this embodiment, with a trench width of approximately 0.6 microns, silicon dioxide layer 106 needs to be deposited to a thickness of at least 3000 Angstroms and should be deposited to a thickness of approximately 4000 Angstroms to ensure that complete filling of trenches 102 occurs. The formation of silicon dioxide layer 106 is performed by low pressure chemical vapor deposition.

A planarizing layer of, for example, photoresist (not shown) is then deposited over silicon dioxide layer 102. Silicon dioxide layer 102 is then planarized down to the surface of silicon dioxide layer 104. Of course, some over-etching of silicon dioxide layer 104 will occur, but this should not appreciably affect performance. The resulting structure has silicon dioxide plugs which are the remainder of silicon dioxide layer 106 as shown in FIG. 4D. A layer of silicon nitride 108 is then deposited on the surface of the structure of FIG. 4D to a thickness of approximately 2400 Angstroms using low pressure chemical vapor deposition.

Silicon nitride layer 108 is then patterned to provide an etch mask for re-etching into silicon dioxide layer 106 to reopen selected trench areas 110. This etching requires an extremely high selectivity to silicon, thus an additional layer of hardened silicon dioxide (not shown) on top of silicon nitride layer 108 may be required. FIG. 5 is a plan view showing the new trenches 110 etched between intercell isolating oxide layers 106. FIGS. 6A–6H are side view perspective diagrams taken along section AA as shown in FIG. 5.

FIG. 6A is a sectional schematic view from section AA of FIG.5. Silicon dioxide layer 111 is formed by rapid thermal oxidation of the P-type substrate in an oxygen ambient at a temperature of approximately 1100° C. for approximately 1.4 minutes. This provides a silicon dioxide layer of approximately 150 Angstroms on P type silicon substrate 10 and a silicon dioxide layer of approximately 200 Angstroms at N+ layers 24 and 34. A layer of polycrystalline silicon is then deposited having a thickness of at least 4000 Angstroms to completely fill trench 110 as shown in FIG. 6B. Polycrystalline silicon layer 112 is deposited by lower pressure chemical vapor deposition. Polycrystalline silicon layer 112 is then masked using conventional photolithographic techniques. Polycrystalline silicon layer 112 is etched using a highly anisotropic process such as that taught by Douglas, et al, supra.. The etching is continued until the unmasked portion of polycrystalline silicon layer 112 is removed down to the bottom of trench 110 as shown in FIG. 6C. A silicon dioxide layer 114 is then deposited using low pressure chemical vapor deposition to a thickness of approximately 2000 Angstroms. This thickness is chosen in order to completely fill the opened portion of trench 110.

Silicon dioxide layer 114 is then etched using a plasma etching process which is highly selective to silicon dioxide to provide silicon dioxide plug 116 as shown in FIG. 6D. For this step, silicon nitride layers 108 may require additional layers (not shown) to allow selective etching of silicon dioxide layer 114. In the region where silicon dioxide plug 116 intersects with silicon dioxide layer 111, a separate numbering of silicon dioxide layer 111 is not shown as silicon dioxide plug 116 and silicon dioxide layer 111 are indistinguishable in this region. A final, short isotropic etch, such as wet chemical etching in dilute hydroflouric acid is then performed to remove the remaining sidewall layer (not shown) of silicon dioxide layer 116. Polycrystalline silicon layer 112 silicon nitride layers 108 are removed using wet etching to produce the structure shown in FIG. 6E.

A second polycrystalline silicon layer 120 is then deposited on the surface of the structure of FIG. 6E to a thickness of at least 4000 Angstroms using low pressure chemical vapor deposition. Polycrystalline silicon layer 120 must be at least 4000 Angstroms in order to fill trench 110. The resulting structure is shown in FIG. 6F.

Polycrystalline silicon layer 120 is then etched back using an anisotropic etch followed by a short isotropic etch to form storage gate 28 as shown in FIG. 6G. An ion implantation of phosphorus ions at an energy of approximately 400 kiloelectron volts and a density of approximately $5 \times 10^{15}$ ions per centimeter squared is then performed to dope the top surface of polycrystalline silicon plug 28 to N+ type. To avoid doping of the sidewalls of trench 110, it may be necessary to form a sacrificial layer of, for example, silicon dioxide (not shown) over the entire structure of FIG. 6G before performing the ion implantation. Thus, the dopant ions will be trapped in the vertical thickness of the sacrificial layer on the sidewalls of the trench but will penetrate the sacrificial layer to dope polycrystalline silicon plug 28 at the bottom of the remaining trench opening.

The sacrificial layer (not shown) and silicon nitride layer 108 are removed using common liquid etching techniques. The remaining structure is subjected to a thermal oxidation process in a steam ambient at approximately 800° C. for approximately 7 minutes to provide silicon dioxide layer 120 having a thickness of approximately 150 Angstroms on the sidewalls of trench 110 and a thickness of approximately 800 Angstroms on the top of storage gate 28, as shown in FIG. 6H. During the thermal oxidation process, dopant atoms from polycrystalline silicon plug 28 will diffuse into substrate 10 to form N+ diffusion 26 as shown in FIG. 6H. A layer of polycrystalline silicon 14 is then deposited to a thickness of at least 4000 Angstroms to provide the structure shown in FIG. 6H. Polycrystalline silicon layer 14 is then patterned using standard photolithographic techniques to provide word lines 14 as shown in FIG. 1.

FIG. 7 is a side view schematic diagram with perspective of another embodiment of the present invention. In FIG. 7, as opposed to the embodiment of FIG. 1, separate integrated gates and word lines 17 and 19 are provided for the write transistor and read transistor of the memory cells, respectively. Write word line 17 and read word line 19 run the length of the array. Bitlines 15 are formed perpendicular to the length of word lines 17 an 19 and make contact to N+ diffusions 24 through vias 25. In the embodiment shown in FIG. 7, adjacent memory cells along the length of word line 17 and 19 have their source diffusions 24 separated from each other by a trench used to cut between them 27 or by providing a patterned diffusion to produce separate regions 24.

FIG. 7 teaches a random access memory comprising: a plurality of memory cells formed in a regular array in a substrate, each cell comprising: a trench formed in said substrate, said substrate having a first conductivity type; a first doped region 34 formed in said substrate at a surface of said trench having a second conductivity type opposite said first conductivity type; a first channel region 32 in said substrate at a surface of said trench, said first channel region being adjacent to said first doped region; a first gate 28 formed in said trench controlling the conductivity of said first channel region, said first gate conductively connected to a surface of said substrate; a second doped region 24-2 formed in said substrate at the intersection of said trench and a major surface of said substrate, said second doped region having said second conductivity; a second channel region 22 formed in said substrate at a surface of said trench, said second channel region being interposed between said second doped region and said first gate; a second gate 19 formed in said trench controlling the conductivity of said second channel region; a third doped region 24-1 formed in said substrate at an intersection between said trench and said major surface of said substrate, said third doped region being separated from said second doped region; a third channel region 20 formed in said substrate at a surface of said trench, said third channel region being interposed between said third doped region and said first gate; and a third gate 17 formed in said trench controlling the conductivity of said third channel region; a fourth doped region 26 formed in said substrate adjacent to said third channel region, said first gate being in physical contact with said fourth doped region.

FIG. 8 is an electrical schematic diagram describing the electrical operation of the embodiment of FIG. 7. In contrast to the embodiment described in FIG. 2, write access transistor 16 and read access transistor 18 are controlled by separate word lines. Also in contrast to the memory cell described in FIG. 2, the sources of transistors 16 and 18 are connected to a common bitline.

FIG. 9 is an electrical schematic diagram of an array using the memory as described in FIG. 8 which is another embodiment of the invention. Because memory cells 112A–112D use separate read and write word lines, sensing the data stored in the memory cells is far easier. To write to the memory cells, the appropriate data signals provided by one of sense amplifiers 140 onto bitline 1 or bitline 2. For example, when writing to memory cell 112-A, the appropriate data signal is placed on bitline 1. The signal on write word line WWL1 is brought to a high voltage level which causes transistor 16 of memory cell 112-A to conduct. Thus, the data signal provided on bitline 1 is stored on the gate of transistor 30 of memory cell 112-A. To read this data, write word line WWL1 is brought to a low voltage signal and read word line RWL1 is brought to a high voltage signal. This causes transistor 18 of memory cell 112-A to conduct. If a high voltage signal is stored on the gate of transistor 30 of memory cell 112-A, both transistor 18 and transistor 30 will conduct and sense amplifier 40 detects continuity with the reference potential Vss indicating the appropriate data signal. If a low voltage signal is stored on transistor 30, transistor 30 will not conduct a non-continuity between bitline 1 and the reference potential Vss will be detected by sense amplifier 40.

Figure 10A:
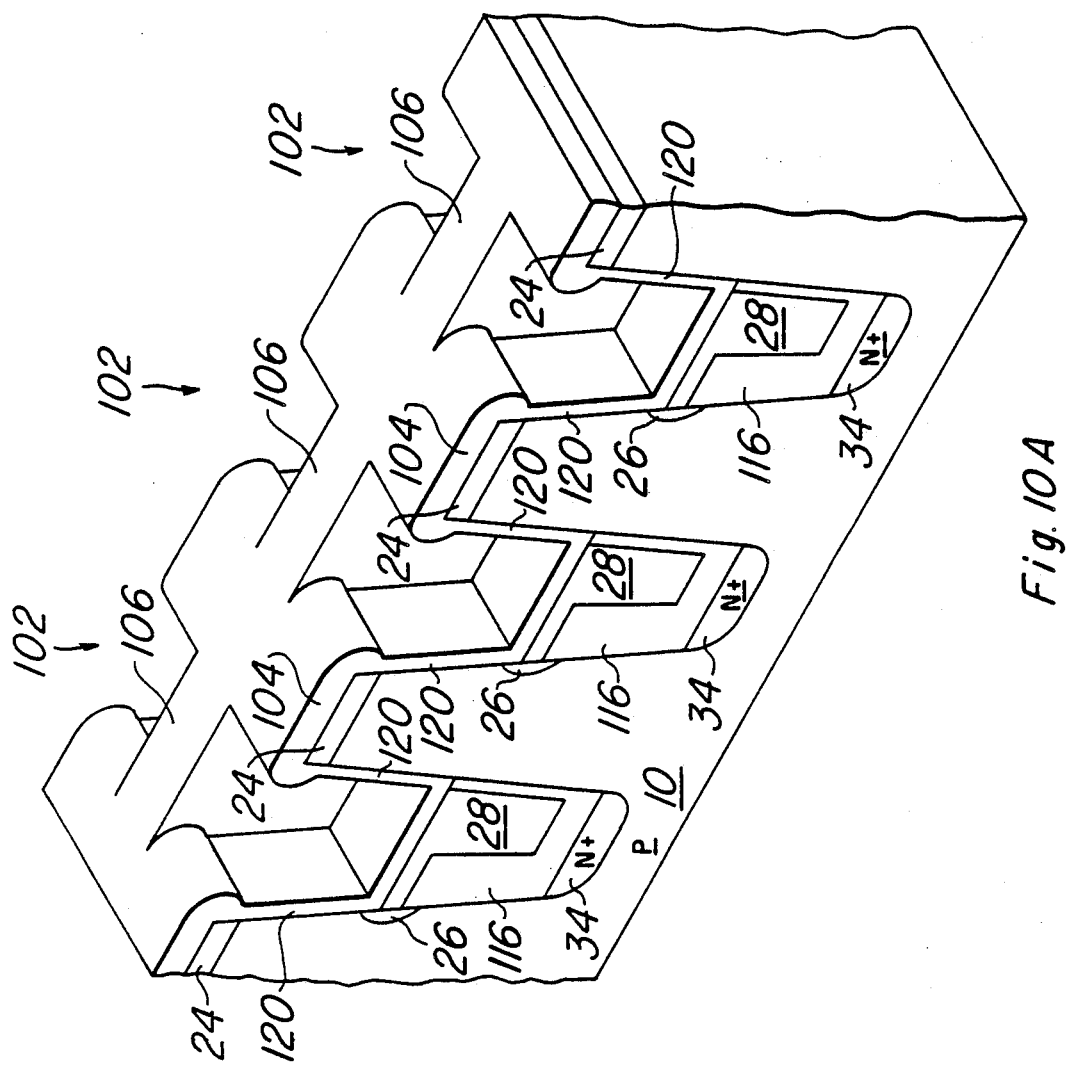
FIGS. 10A through 10E are side view perspective diagrams showing the finals steps of fabricating the embodiment of FIG. 7.
Figure 10B:
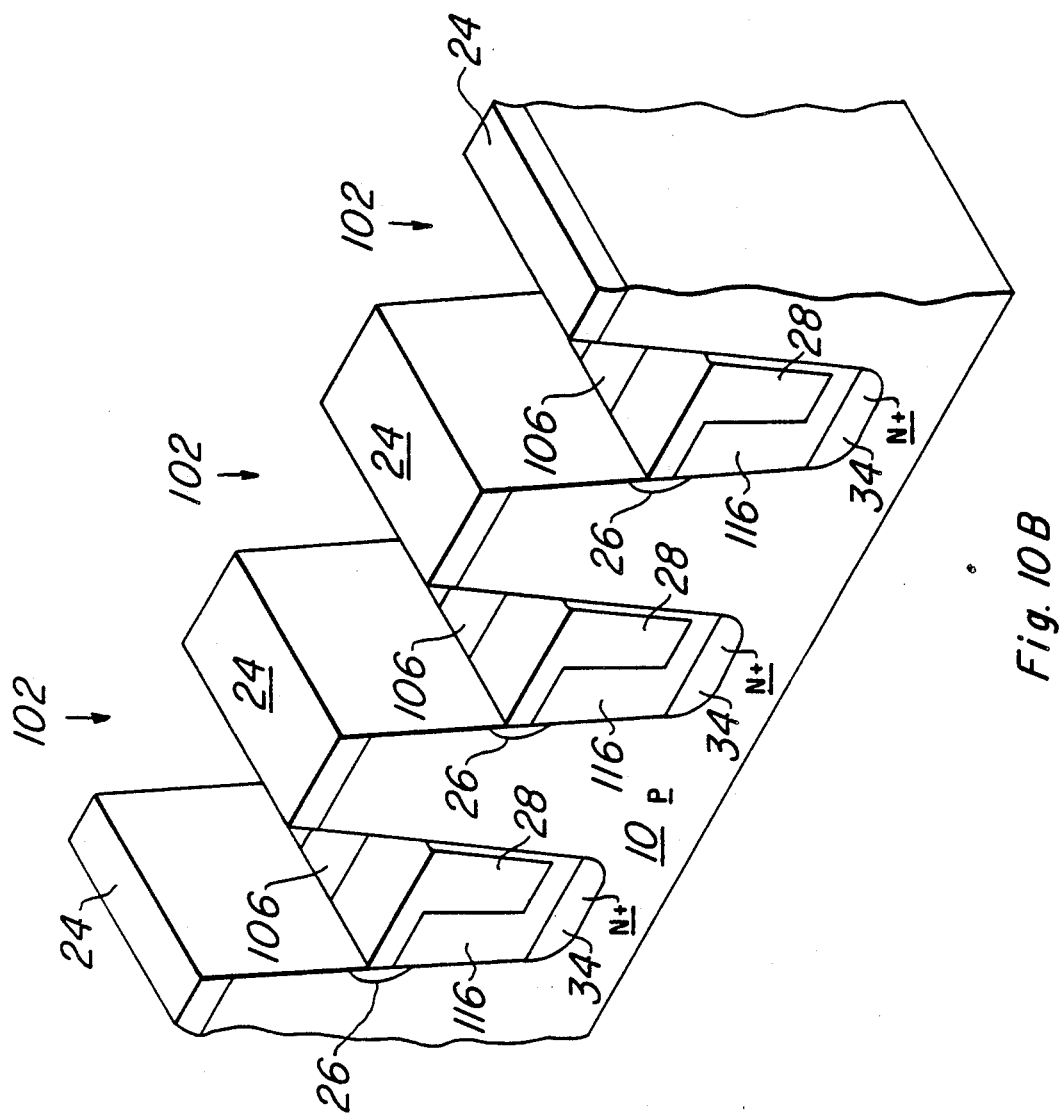
Figure 10C:
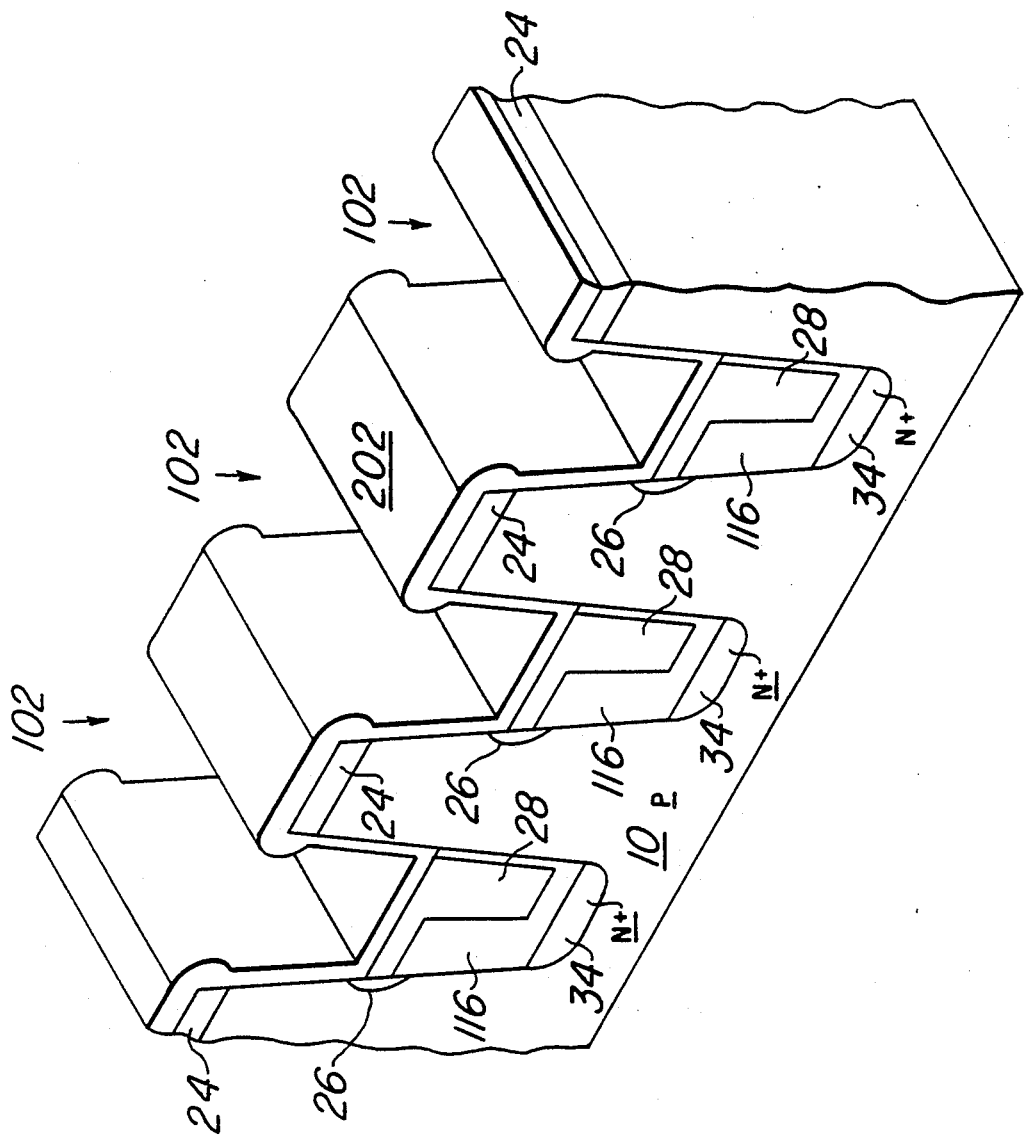

FIG. 10A is a side view schematic diagram with perspective of the structure of FIG. 6H with word line 14 removed. This is the starting point of the processing steps necessary to fabricate the embodiment of FIG. 7. The structure of FIG. 10A is subjected to an anisotropic silicon dioxide etch such as CF$_4$ until silicon dioxide regions 106 are flush with the top of polysilicon plugs 28. A wet etch is then performed to ensure that the sidewalls of trenches 102 are cleared of silicon dioxide as shown in FIG. 10B. Note that N+ diffusions 24 run the length of the array parallel to the trenches. In an alternative embodiment, the ion implantation which forms N+ regions 24 is performed using an ion implantation mask which causes regions 24 to be segmented providing a separate region 24 between each pair of memory cells along a bitline. The structure of FIG. 10B is then subjected to a thermal oxidation process in a steam ambient at a temperature of approximately 850° C. for approximately 7 minutes. This provides silicon dioxide layer 202 as shown in FIG. 10C. Because of differential oxidation with higher rates of thermal oxidation formation from heavily doped regions, silicon dioxide layer 202 will be thicker when in contact with the top of N+ plug 28 and N+ diffusions 24. On the sidewalls of trenches 102, silicon dioxide layer 202 will be approximately 800 Angstroms thick.

Figure 10D:
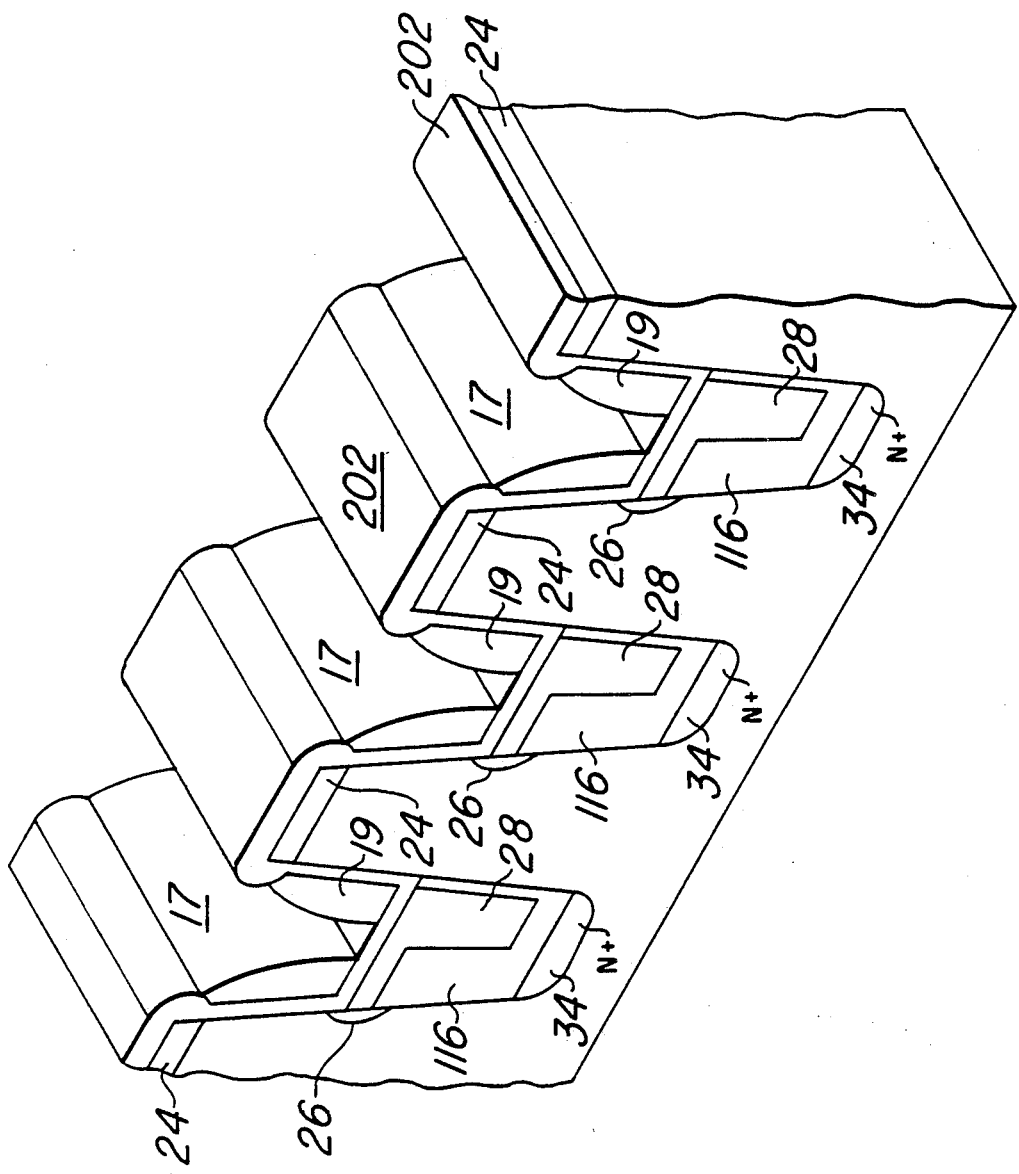
Figure 10E:
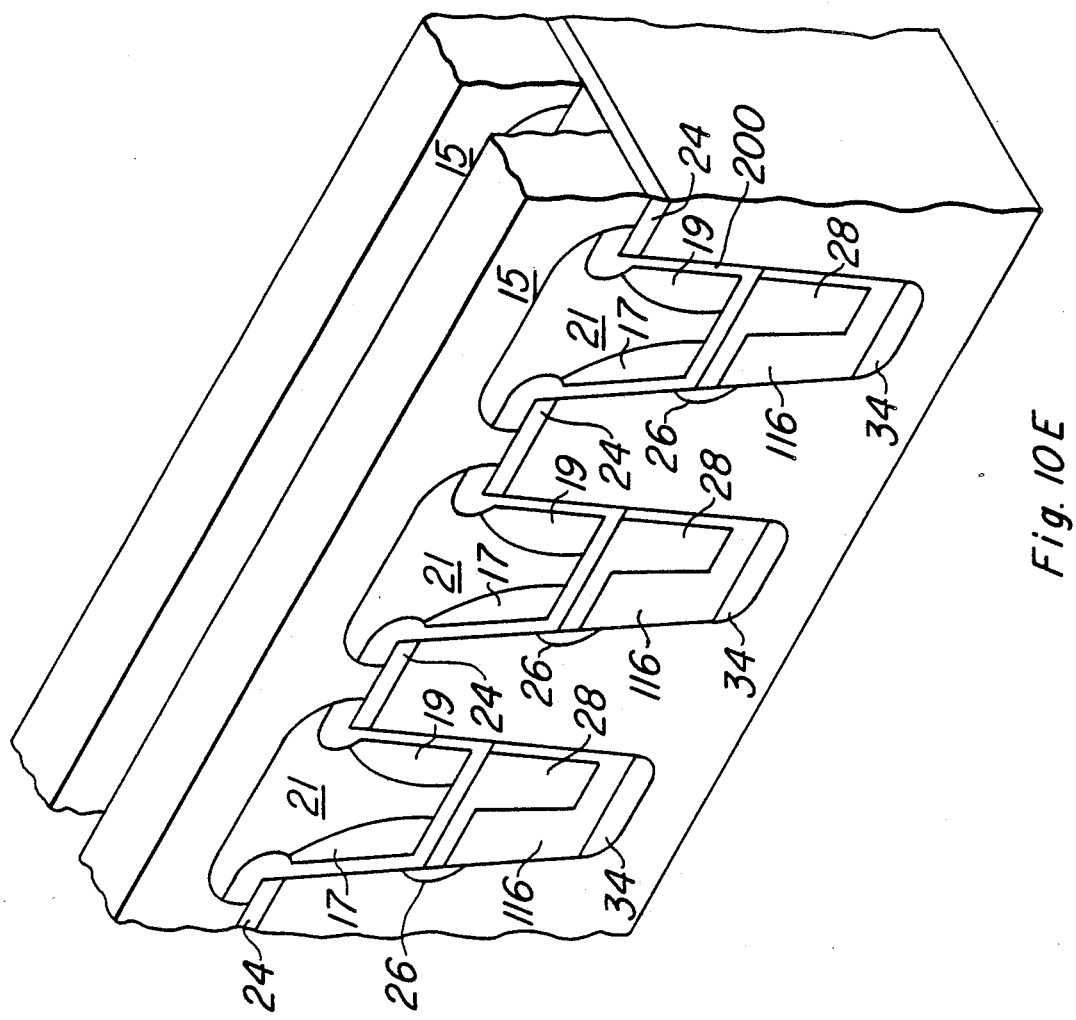

A layer of polycrystalline silicon having a thickness of approximately one third less than that of the trench opening is then deposited over the structure of FIG. 10C. This layer of polycrystalline silicon (not shown) is then anisotropically etched to remove the polycrystalline silicon on the horizontal surfaces of the structure of FIG. 10C. This anisotropic etch leaves polycrystalline silicon filaments 17 and 19 as shown in FIG. 10D. A conformal layer of silicon dioxide having a thickness of at least 3000 Angstroms is then deposited over all and planarized to form silicon dioxide region 21 as shown in FIG. 10E. Silicon dioxide layer 21 is patterned and vias 25 are formed to diffusions 24. A conductive layer 15 is then deposited and patterned to form bitline 15. Bitline 15 may be formed of any suitable conductive material such as tungsten, titanium aluminum or polycrystalline silicon or combinations of these conductors. In one embodiment, the area between bitlines 15 is etched further until N+ regions 24 are divided in the areas between bitlines 15. Thus, the embodiment shown in FIG. 7 is fabricated. Although specific embodiments of the present invention are herein described, they are not to be construed as limiting the scope of the invention. The scope of the invention is only limited by the claims appended hereto, wherein:

What is claimed is:

1. A device comprising:
a substrate having a first conductivity type and having a trench formed therein;
a first doped region formed in said substrate at a surface of said trench having a second conductivity type opposite said first conductivity type;
a first channel region in said substrate at a surface of said trench, said first channel region being adjacent to said first doped region;
a first gate formed in said trench controlling the conductivity of said first channel region, said first gate conductively connected to a surface of said substrate;
a second doped region formed in said substrate at the intersection of said trench and a major surface of said substrate, said second doped region having said second conductivity type;
a second channel region formed in said substrate at a surface of said trench, said second channel region being interposed between said second doped region and said first gate;
a second gate formed in said trench controlling the conductivity of said second channel region;
a third doped region formed in said substrate at an intersection between said trench and said major surface of said substrate, said third doped region being separated from said second doped region;
a third channel region formed in said substrate at a surface of said trench, said third channel region being interposed between said third doped region and said first gate; and
a third gate formed in said trench controlling the conductivity of said third channel region.

2. A device as in claim 1, further comprising: a fourth doped region formed in said substrate adjacent to said third channel region, said first gate being in physical contact with said fourth doped region.

3. A device as in claim 1, wherein said first gate is separated from said first channel region by a dielectric layer.

4. A device as in claim 3, where said dielectric layer comprises silicon dioxide.

5. A device as in claim 3, where said dielectric comprises a multilayer structure including at least one layer of silicon dioxide and at least one layer of silicon nitride.

6. A random access memory comprising:
a plurality of memory cells formed in a regular array in a substrate, each cell comprising:
a trench formed in said substrate, said substrate having a first conductivity type;
a first doped region formed in said substrate at a surface of said trench having a second conductivity type opposite said first conductivity type;
a first channel region in said substrate at a surface of said trench, said first channel region being adjacent to said first doped region;
a first gate formed in said trench controlling the conductivity of said first channel region, said first gate conducter connected to a surface of said substrate;
a second doped region formed in said substrate at the intersection of said trench and a major surface of said substrate, said second doped region having said second conductivity;
a second channel region formed in said substrate at a surface of said trench, said second channel region being interposed between said second doped region and said first gate;
a second gate formed in said trench controlling the conductivity of said second channel region;
a third doped region formed in said substrate at an intersection between said trench and said major surface of said substrate, said third doped region being separated from said second doped region;
a third channel region formed in said substrate at a surface of said trench, said third channel region being interposed between said third doped region and said first gate; and
a third gate formed in said trench controlling the conductivity of said third channel region.

7. A device as in claim 6, further comprising:

a fourth doped region formed in said substrate adjacent to said third channel region, said first gate being in physical contact with said fourth doped region.

8. A device as in claim 6, wherein said first gate is separated from said first channel region by a dielectric layer.

9. A device as in claim 8, where said dielectric layer comprises silicon dioxide.

10. A device as in claim 8, where said dielectric comprises a multilayer structure including at least one layer of silicon dioxide and at least one layer of silicon nitride.

* * * * *